(12) United States Patent
Matsushige

(10) Patent No.: US 9,001,591 B2
(45) Date of Patent: Apr. 7, 2015

(54) SEMICONDUCTOR DEVICE

(75) Inventor: Muneaki Matsushige, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 329 days.

(21) Appl. No.: 13/479,379

(22) Filed: May 24, 2012

(65) Prior Publication Data

US 2012/0307543 A1 Dec. 6, 2012

(30) Foreign Application Priority Data

May 31, 2011 (JP) .................................. 2011-122096

(51) Int. Cl.
*G11C 11/34* (2006.01)
*G11C 8/14* (2006.01)
*G11C 11/4091* (2006.01)
*G11C 11/4094* (2006.01)
*G11C 11/4097* (2006.01)

(52) U.S. Cl.
CPC .............. *G11C 8/14* (2013.01); *G11C 11/4091* (2013.01); *G11C 11/4094* (2013.01); *G11C 11/4097* (2013.01)

(58) Field of Classification Search
USPC .................... 365/63, 185.13, 185.11, 185.05, 365/185.25, 203
See application file for complete search history.

(56) References Cited

U.S. PATENT DOCUMENTS

| | | | |
|---|---|---|---|
| 5,636,174 A * | 6/1997 | Rao | 365/230.03 |
| 5,652,726 A | 7/1997 | Tsukude et al. | |
| 5,940,329 A * | 8/1999 | Seitsinger et al. | 365/189.05 |
| 6,078,542 A | 6/2000 | Tomishima | |
| 2001/0017813 A1 | 8/2001 | Uchida et al. | |
| 2001/0028592 A1 | 10/2001 | Sekiguchi et al. | |
| 2002/0159318 A1 * | 10/2002 | Arimoto et al. | 365/203 |
| 2007/0183235 A1 * | 8/2007 | Park | 365/203 |
| 2010/0091589 A1 | 4/2010 | Lee | |

FOREIGN PATENT DOCUMENTS

| | | |
|---|---|---|
| JP | 6-150655 A | 5/1994 |
| JP | 8-167290 A | 6/1996 |
| JP | 2000-11639 A | 1/2000 |
| JP | 2001-243762 A | 9/2001 |
| JP | 2001-273764 A | 10/2001 |

OTHER PUBLICATIONS

Office Action issued Sep. 24, 2014, in Japanese Patent Application No. 2011-122096.

* cited by examiner

*Primary Examiner* — Son Dinh
*Assistant Examiner* — Uyen B Tran
(74) *Attorney, Agent, or Firm* — Miles & Stockbridge P.C.

(57) ABSTRACT

A semiconductor device including multiple subarrays arrayed in a matrix in the row and column directions, and respectively containing multiple memory cells, bit lines coupled to the memory cells, and precharge circuits (to charge the bit lines; column select signal lines extending in the column direction for selecting subarray columns; main word lines for selecting subarray rows; and precharge signal lines for supplying precharge signals to the precharge circuits; and at least two of the subarrays formed in the row direction or the column direction are controlled by the same logic according to the precharge signal.

13 Claims, 13 Drawing Sheets

SEMICONDUCTOR DEVICE

CROSS-REFERENCE TO RELATED APPLICATIONS

The disclosure of Japanese Patent Application No. 2011-122096 filed on May 31, 2011 including the specification, drawings and abstract is incorporated herein by reference in its entirety.

BACKGROUND

The present invention relates to technology for a semiconductor device.

Along with expanded device capacity, demand has increased in recent years for DRAM (Dynamic Random Access Memory) possessing higher speed, and low power consumption, so memory cell arrays are generally subdivided into subarrays and each subarray is controlled separately. Each of the subarrays are selected by main word lines extending along the row direction and column selection lines extending along the column direction. The memory cells within each subarray are arrayed in a matrix, and subword lines extend in the row direction and bit lines in the column direction. DRAM possessing this type of structure are called hierarchical DRAM and hierarchical DRAM are disclosed in the Japanese Unexamined Patent Application Publication No. 2001-273764, Japanese Unexamined Patent Application. Publication No. 2000-011639, and Japanese Unexamined Patent Application Publication No. 2001-243762.

This hierarchical DRAM requires a subword driver for driving the subword line. More specifically, a logic circuit is needed for inputting main word line signals and column select line signals. Moreover, each subarray includes a sense amplifier. Signals such as sense enable signal, a precharge signal, and bit line (Y switch select) signal are input to each sense amplifier. These signals are generated by logic circuits that input the column select line signals and signals of the main signal lines (main sense enable signal lines, main precharge signal lines, main bit select lines) that are arrayed parallel to the main word lines.

SUMMARY

The present inventors perceived the following problems. The hierarchical DRAM as described above requires a logic circuit for generating the control signals causing the problem that a larger circuit scale is needed.

In the semiconductor device according to one aspect of the present invention, the precharge signal lines are jointly coupled to at least two subarrays adjacently formed along the row direction among multiple subarrays, and the same logic precharge signal is input to the precharge circuits for the applicable two subarrays. Therefore no logic circuit is required for generating a precharge signal from the main precharge signal and the main precharge signal line so the DRAM can be fabricated on a small circuit scale.

According to the aspect of the present invention, there can be provided a semiconductor device with a small circuit scale.

BRIEF DESCRIPTION

DETAILED DESCRIPTION

Figure 1:
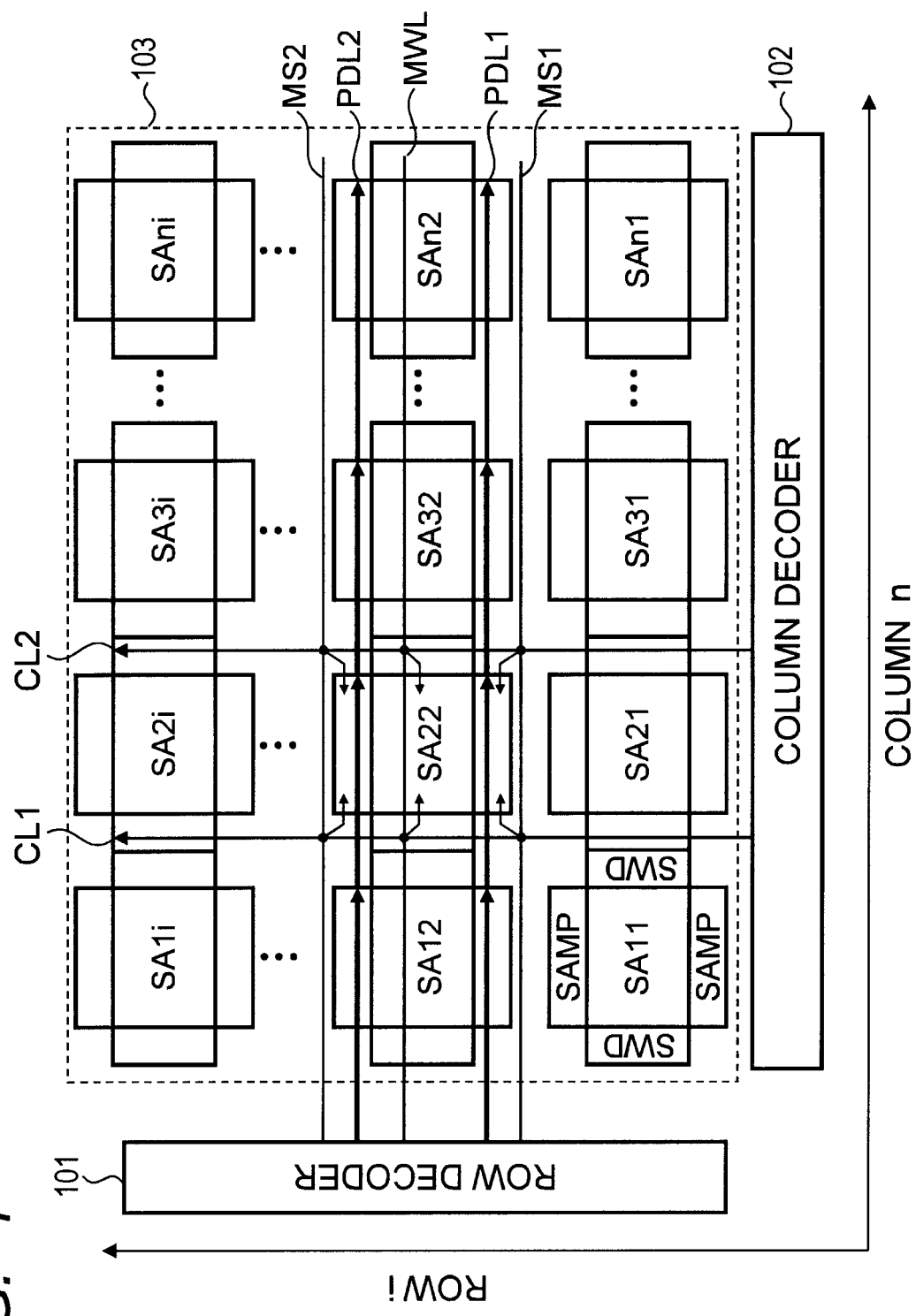
FIG. 1 is a diagrammatic flat view of the hierarchical DRAM according to the first embodiment.

The embodiments of the present invention are described next while referring to the drawings. However the invention is not limited by the embodiments described below. Moreover, in order to clarify the invention, the drawings and description are abbreviated as needed.

First Embodiment

The semiconductor device of the first embodiment of the present invention and more specifically the semiconductor device serving as the hierarchical DRAM are described next while referring to FIG. 1. FIG. 1 is a diagrammatic flat view of the hierarchical DRAM according to the first embodiment.

The hierarchical DRAM as shown in FIG. 1 is comprised of a row decoder 101, a column decoder 102, and a cell array 103. The cell array 103 here includes the subarrays SA11-SA1i, the subarrays SA21-2i, the subarrays SA31-3i, . . . , the subarrays SAn1-SAni for a total of nxi subarrays. Restated in other words, the subarrays are formed in a matrix of i rows and n columns as shown using the coordinates in FIG. 1.

Each subarray as shown represented by the subarray SA11 in FIG. 1, is comprised of a sense amplifier SAMP on both sides of the subarray SA11 in the column direction (above and below the subarray SA1 in FIG. 1), and the subword drivers SWD on both sides of subarray SA11 along the row direction (left and right of subarray SA11 in FIG. 1). Though not shown in the figure, besides the memory cells formed in a matrix within each subarray (e.g. SA11), the subword lines extend along the row direction and the bit lines extend along the column direction.

Moreover, each subarray row (generally also called a bank) also contains signal line groups extending from the row decoder 101 to the end of the cell array 103 (on the right and left as shown in FIG. 1). In FIG. 1, these signal line groups are only drawn for the subarray rows comprised of the subarrays SA12, SA22, SA32 . . . , SAn2 and are omitted from the other subarray rows.

Here the signal line group as shown in FIG. 1 is comprised of a pair of main signal lines MS1, MS2 and precharge signal lines PDL1, PDL2 formed one pair each, are input to the sense amplifiers SAMP formed one above and below the subarrays SA12, SA22, SA32 . . . , SAn2.

This signal line group also contains the main word lines MWL input to the subword drivers SWD formed on the left and right of the subarrays SA12, SA22, SA32, . . . , and SAn2. In the present embodiment, the main signal lines and precharge signal lines are formed one pair each, however a pair is not a requirement and each may be formed on just one side.

On the other hand, one pair of column select signal lines CL1, CL2 is formed extending in the column direction (upward and downward direction in FIG. 1) from the column decoder 102 to the end of the cell array 103 in each of the subarray columns.

In FIG. 1, the column select signal lines are drawn only for the subarray column from the subarrays SA21, SA22, . . . , SA2i, and the other subarray columns are omitted. The signal line group extending along the rows, and the column select signal lines extending along the columns in this way individually control each of the subarrays.

The subarray SA22 in FIG. 1 for example is controlled by the main word lines MWL, main signal lines MS1, MS2, and the precharge signal lines PDL1, PDL2 extending in the row direction, and the column select signal lines CL1, CL2 extending in the column direction. A detailed circuit structure is described later on utilizing FIG. 2.

The row decoder 101 outputs a main word line signal to the main word line (MWL) of the subarray row for selection based on the supplied address signal. The row decoder 101 also outputs a sense enable signal and a Y switching signal to the main signal line (e.g. MS1 or MS2) of the subarray row for selection. Moreover, the row decoder 101 outputs a precharge signal to the precharge signal line (e.g. PDL1 or PDL2) of the subarray row for selection.

The column decoder 102 on the other hand outputs a column select signal for selecting one of the subarray columns to the column select signal line (e.g. CL1 or CL2) formed at the subarray column for selection.

Figure 2:
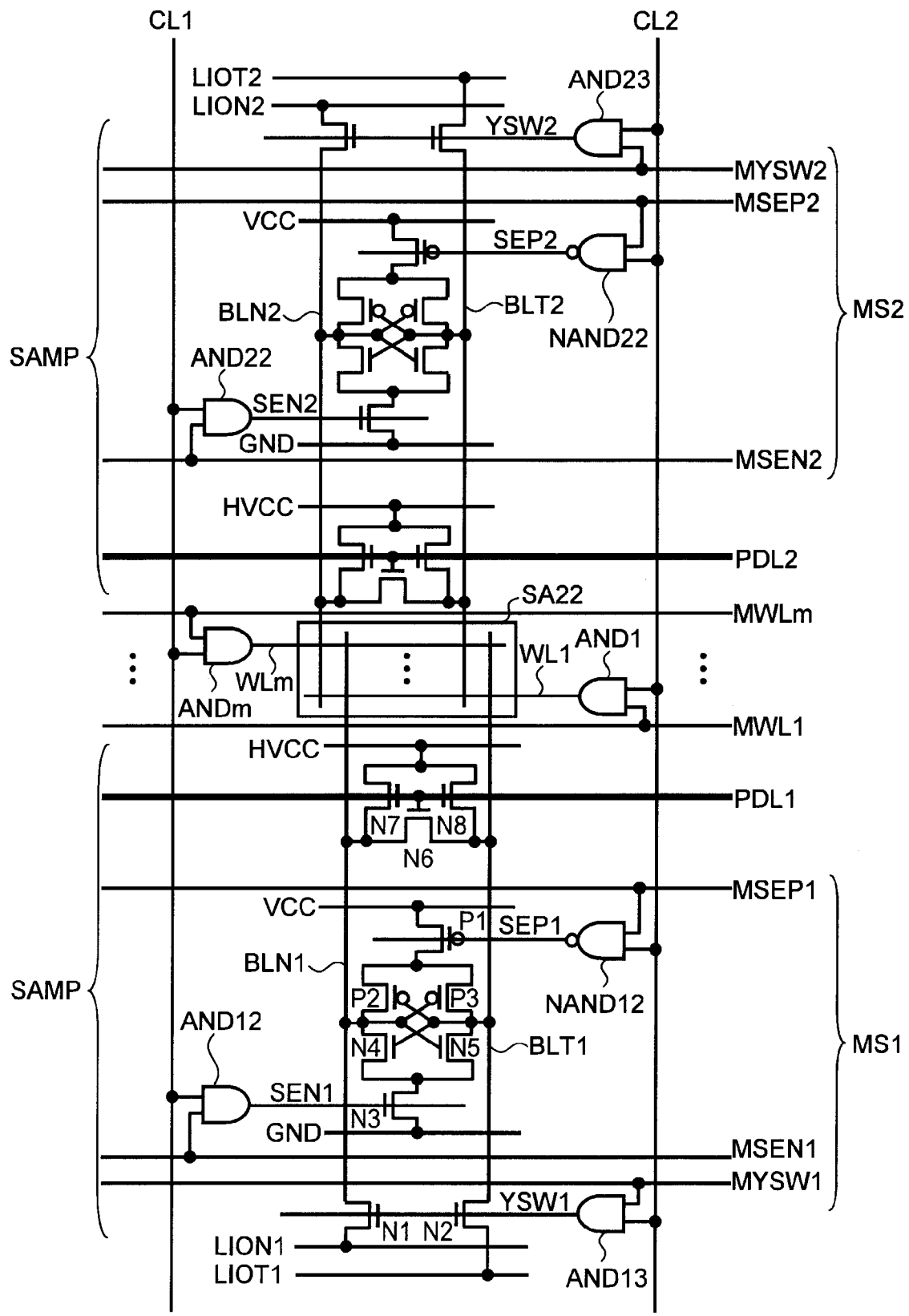
FIG. 2 is a circuit diagram of one subarray of the hierarchical DRAM according to the first embodiment.

The detailed circuit structure of the subarray SA22 serving as one example of subarray is described next utilizing FIG. 2. FIG. 2 is a circuit diagram of one subarray SA22 of the hierarchical DRAM according to the first embodiment.

The subarray SA22 includes m number of subword lines WL1-WLm, m number of AND gates AND1-ANDm, and m number of main word lines MWL1-MWLm. The main word lines MWL1-MWLm are coupled to one of the inputs of each of the AND gates AND1-ANDm. In FIG. 2, the other input of the AND gate AND1 is coupled to a column select signal line CL2; and the other input of the AND gate ANDm is coupled to a column select signal line CL1. The AND gate AND1-ANDm outputs are coupled to the respective subword lines WL1-WLm.

The sense amplifiers SAMP are formed above and below the subarray 22 just as described in FIG. 1. The same structure is employed on the upper side and lower side of the subarray SA22 as shown in FIG. 2. The structure on the lower side is therefore described next.

At the lower side of this subarray SA22, the precharge signal line PDL1 and the main signal line MS1 extend in parallel with the main word lines MWL1-MWLm; and one pair of column select signal lines CL1, CL2 extend in the column direction to approximately intersect at right angles.

The main signal line MS1 here includes three control signal lines comprised of a main Y switching signal line MYSW1, and one pair of main sense enable signal lines MSEN1, MSEP1. These signal lines included in the main signal line MS1 are coupled by way of the respective logic circuits to the sense amplifier SAMP.

A detailed description is given next in order from the lower side of FIG. 2. First of all, the main Y switching signal MYSW1 is coupled to one input of the AND gate AND13. The other input of the AND gate AND 13 is coupled to the column select signal line CL2. The output of the AND gate AND13 is coupled to the sub Y switching signal line YSW1.

Here, "sub" signifies the interior of the subarray. The same meaning extends to the other structural elements. The column select signal line CL2 and CL1 utilize identical logic so the other input of the AND gate AND13 may be logically coupled to the column select signal line CL1. The same arrangement can also apply to the other logic gates.

The sub Y switching signal line YSW1 is jointly coupled to the gates of the NMOS transistors N1, N2 that configure the Y switch of the bit line pair BLN1, BLT1. Therefore, if the main Y switching signal line MYSW1 and the column select signal line CL2 have both reached the H (High) state, then the sub Y switching signal line YSW1 reaches the H state, and the NMOS transistors N1, N2 both turn on. In all other cases the sub Y switching signal line YSW1 is L (Low) state, and the NMOS transistors N1, N2 are both off.

The bit line pair BLN1, BLT1 are respectively coupled via the NMOS transistors N1, N2 to the local data lines LION1, LIOT1. The local data lines LION1, LIOT1 are coupled to the read data amplifier and the write data amplifier not shown in the drawings.

Next, the main sense enable signal line MSEN1 is coupled to one input of the AND gate AND12. The other input of the AND gate AND12 is coupled to the column select signal line CL1. The output of the AND gate AND12 is coupled to the subsense enable signal line SEN1. The subsense enable signal line SEN1 is coupled to the gate of the NMOS transistor N3 serving as the switch for the sense amplifier for the bit line pair BLN1, BLT2.

Therefore, when the main sense enable signal line MSEN1 and the column select signal line CL1 are both H (high state), then the subsense enable signal line SEN1 reaches the H state, and the NMOS transistor N3 turns on. In all other cases, the subsense enable signal line SEN1 is L (low state) and the NMOS transistor N3 is off.

Next, the main sense enable signal line MSEP1 is coupled to one input of the NAND gate NAND12. The other input of the NAND gate NAND12 is coupled to the column select signal line CL2. The output of the NAND gate NAND12 is coupled to the subsense enable signal line SEP1. The subsense enable signal line SEP1 is coupled to the gate of the PMOS transistor P1 serving as the switch for the sense amplifier for the bit line pair BLN1, BLT1.

Therefore when the main sense enable signal line MSEP1 and the column select signal line CL2 are both in the H (high) state, the subsense enable signal line SEP1 then reaches the L (low) state, and the PMOS transistor P1 turns on. In all other cases, the subsense enable signal line SEP1 is in the H (high) state, and the PMOS transistor P1 is off.

The sense amplifier for the bit line pair BLN1, BLT1 is described here. In addition to the two switching transistors (NMOS transistor N3, PMOS transistor P1) described above, this sense amplifier includes four transistors (NMOS transistors N4, N5, PMOS transistors P2, P3) to configure a latch circuit.

The NMOS transistor N4 and the PMOS transistor P2 configure an inverter. In other words, the drains of the NMOS transistor N4 and the PMOS transistor P2 are mutually coupled together, and their gates are mutually coupled together. Moreover, the NMOS transistor N5 and the PMOS transistor P3 configure an inverter. In other words, the drains of the NMOS transistor N5 and the PMOS transistor P3 are mutually coupled together and their gates are mutually coupled together.

Also, the node where the drains of the NMOS transistor N4 and the PMOS transistor P2 are coupled is also coupled to the node where the gates of the NMOS transistor N5 and the PMOS transistor P3 are mutually coupled and coupled to the bit line BLN1. In the same way, the node where the drains of the NMOS transistor N5 and the PMOS transistor P3 are mutually coupled is coupled to the node where the gates of the NMOS transistor N4 and the PMOS transistor P2 are coupled and coupled to the bit line BLT1.

The sources of the NMOS transistors N4, N5 are both coupled to the drains of the NMOS transistor N3. The source of the NMOS transistor N3 is coupled to ground (ground voltage GND). The sources of the PMOS transistors P2, P3 on the other hand are both coupled to the drain of the PMOS transistor P1. The source of the PMOS transistor P1 is coupled to the power supply (supply voltage VCC). The sense amplifier operates (is driven) when the PMOS transistor P1 and NMOS transistor N3 are both on.

The precharge signal line PDL1 is described next. The precharge signal line PDL1 is directly coupled to the precharge circuit without utilizing a logic gate. The precharge circuit is here comprised of three NMOS transistors N6-N8.

The gates of the NMOS transistors N6-N8 are jointly coupled to the precharge signal line PDL1. One of either the source or drain of the NMOS transistor N6 is coupled to the BLN1, and the other source or drain is coupled to the bit line BLT1. One of either the source or drain of the NMOS transistor N7 is coupled to the bit line BLN1, and a precharge voltage HVCC (half the voltage of the supply voltage VCC) is applied to the other (source or drain). One of either the source or drain of the NMOS transistor N8 is coupled to the bit line BLT1, and a precharge voltage HVCC is applied to the other (source or drain).

Therefore, when the precharge signal line PDL1 is in the H (high) state then all of the three NMOS transistors N6-N8 turn on, and a precharge voltage HVCC is applied to the bit line pairs BLN1, BLT1. When the precharge signal line PDL1 reaches the L (low) state then the three NMOS transistors N6-N8 turn off, and no precharge voltage HVCC is applied to the bit line pairs BLN1, BLT1. The precharge voltage is not limited in particular to the HVCC (half the voltage of the supply voltage VCC).

The precharge signal line PDL1 is here jointly coupled to precharge circuits for all the bit line pairs for the sense amplifiers SAMP on the upper side of the subarray SA22. Namely, the precharge signal line PDL1 is directly coupled without a logic gate. Though described in detail later on, up until now, it was necessary to form the main precharge signal line and the sub-precharge signal line into two separate wiring layers. In contrast, in the present embodiment the precharge signal line PDL1 is only formed from a single wiring layer.

The precharge signal line PDL1 is also jointly coupled to precharge circuits for all the bit line pairs for the sense amplifiers SAMP on the upper side of the subarrays SA12, SA32, . . . , SAn2 belonging to the same subarray column as the subarray SA22 in FIG. 1.

Therefore when the main word line MWL1 and the column select signal line CL2 are both in the H (high) state, then the subword line WL1 reaches the H state, and memory cell row within the subarray SA22 coupled to the subword line WL1 is selected. In all other cases, the subword line WL1 is in the L (low) state, and the memory cell row within the subarray SA22 coupled to the subword line WL1 is not selected.

The structure on the upper side of the subarray SA22 is described next. On the upper side of this subarray SA22, the main word lines MWL1-MLm and the precharge signal line PDL2 extend along a row in parallel with the main word lines MWL1-MWLm and the main signal line MS2, intersect at approximately right angles, the pair of column select signal lines CL1 and CL2 extending in the column direction.

The main signal line MS2 here includes three control signal lines comprised of the main Y switching signal line MYSW2, and the pair of main sense enable signal lines MSEN2, MSEP2. These signal lines contained within the main signal line MS2 are coupled by way of the respective logic circuits to the sense amplifier SAMP.

The sequence starting from the upper side of FIG. 2 is described next. As already described, the structure on the lower side of the subarray SA22 is overall the same as the structure on the upper side. First of all, the main Y switching signal line MYSW2 is coupled on one input of the AND gate AND 23. The other input of the AND gate AND23 is coupled to the column select signal line CL2. The output of the AND gate AND 23 is coupled to the sub Y switching signal line YSW2.

The sub Y switching signal line YSW2 is jointly coupled to the gates of the two NMOS transistors that configure the Y switches for the bit line pair BLN2 and BLT2. Therefore, when the main Y switching signal line MYSW2 and the column select signal line CL2 are both in the H (high) state, then the sub Y switching signal line YSW2 reaches the H state, and the two NMOS transistor both turn on. In all other cases, the sub Y switching signal line YSW2 is in the L (low) state, and the two NMOS transistors are off.

The bit line pair BLN2, BLT2 are both coupled by way of the respective NMOS transistors to the local data lines LION2, LIOT2. The local data lines LION2, LIOT2 are coupled to a read data amplifier and a write data amplifier not shown in the drawing.

Next, the main sense enable signal line MSEP2 is coupled to one of the inputs of the NAND gate NAND22. The other input of the NAND gate NAND22 is coupled to the column select signal line CL2. The output of the NAND gate NAND22 is coupled to the subsense enable signal line SEP2. The subsense enable signal line SEP2 is coupled to the gate of the PMOS transistor serving as the switch for the sense amplifier for the bit line pair BLN2, BLT2.

Therefore when the main sense enable signal line MSEP2 and the column select signal line CL2 are both in the H state, then the subsense enable signal line SEP2 reaches the L state, and this PMOS transistor turns on. In all other cases, the subsense enable signal line SEP2 is in the H state, and this PMOS transistor is off.

Next, the main sense enable signal line MSEN2 is coupled to one input of the AND gate AND22. The other input of the AND gate AND22 is coupled to the column select signal line CL1. The output of the AND gate AND22 is coupled to the subsense enable signal line SEN2. This subsense enable signal line SEN2 is coupled to the gate of the NMOS transistor serving as the switch for the sense amplifier for the bit line pair BLN2, BLT2.

Therefore, when the main sense enable signal line MSEN2 and the column select signal line CL1 are both in the H state, the subsense enable signal line SEN2 reaches the H state, and this NMOS transistor turns on. In all other cases, the subsense enable signal line SEN2 is in the L state, and this NMOS transistor is off.

The sense amplifier for the bit line pair BLN2, BLT2 here possesses the same structure as the sense amplifier for the bit line pair BLN1, BLT1.

The precharge signal line PDL2 is described next. The precharge signal line PDL2 is coupled directly to the precharge circuit without a logic gate. The precharge circuit here is comprised of three NMOS transistors the same as the sense amplifier SAMP on the lower side.

Therefore, when the precharge signal line PDL2 is in the H state, the three NMOS transistors then all turn on, and a precharge voltage HVCC is applied to the bit line pair BLN2, BLT2. If the precharge signal line PDL2 is in the L state, then the three NMOS transistors all turn off, and no precharge voltage HVCC is applied to the bit line pair BLN2, BLT2.

Accordingly, when the main word line MWLm and the column select signal line CL1 are both in the H state, then the subword line WL2 reaches the H state, and a memory cell row within the subarray SA22 coupled to the subword line WL2 is selected. In all other cases, the subword line WL2 is in the L (low) state, and the memory cell row within the subarray SA22 coupled to the subword line WL2 is not selected.

In FIG. 2, only one pair of bits lines BLN1, BLT1, and the other pair of bit lines BLN2, BLT2 are respectively shown above and below the subarray SA22; however, multiple bit line pairs can of course be formed.

Each main signal line here requires NAND gates (NAND12, NAND22 in FIG. 2) and AND gates (AND12, AND22 in FIG. 2) for the subsense enable signal line. Each main signal line in the same way also requires AND gates (AND 13, AND23 in FIG. 2) for the sub Y switching signal line. The bit line pairs are usually subdivided into a number of blocks, and AND gates for main signal lines and sub Y switching signal lines are formed in each block.

Figure 3:
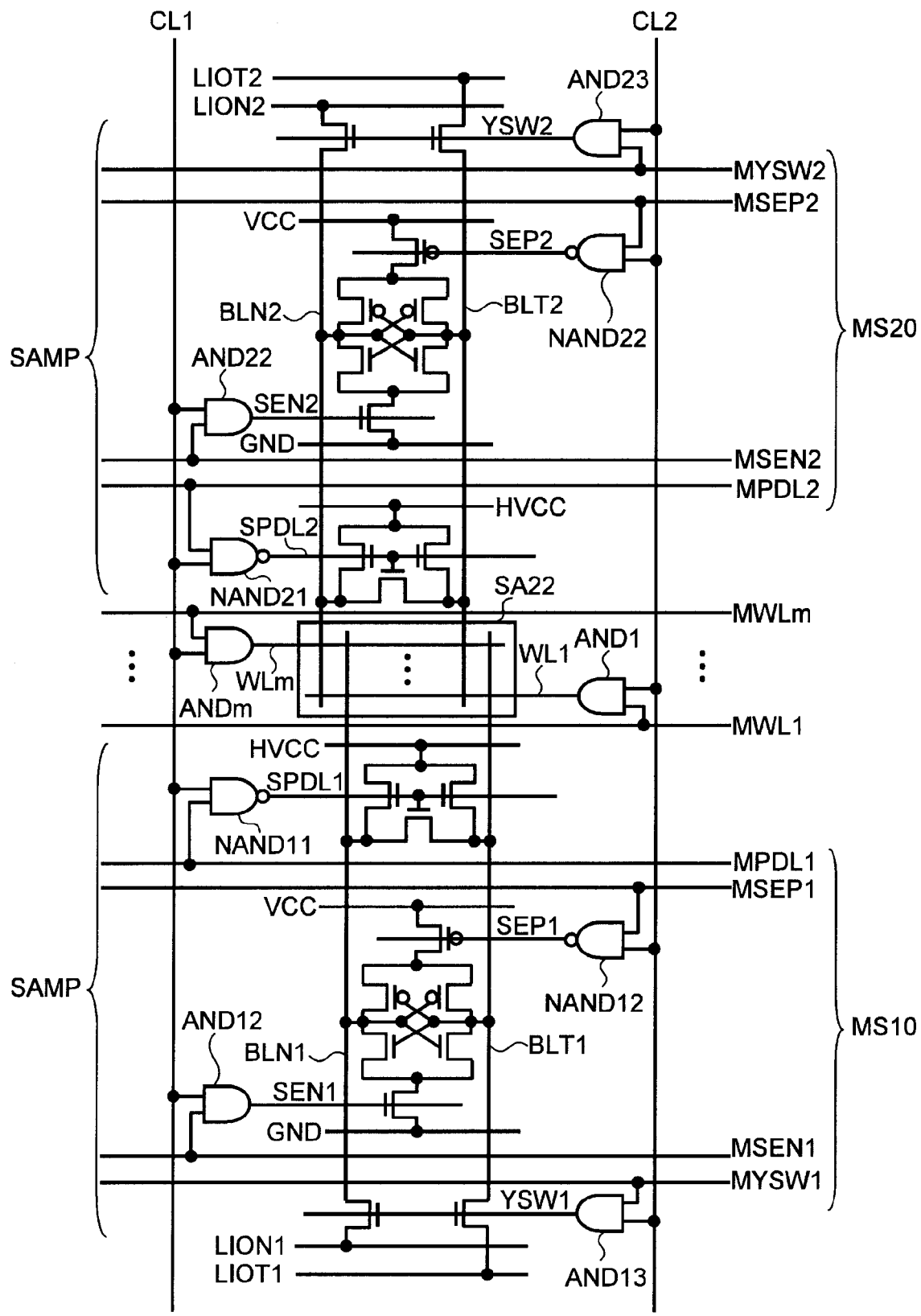
FIG. 3 is a circuit diagram of one subarray of the hierarchical DRAM of a comparative example of the first embodiment.

The detailed circuit structure for one subarray relating to the first comparative example of the first embodiment is described next while referring to FIG. 3. FIG. 3 is a circuit diagram of one subarray SA22 of the hierarchical DRAM of a comparative example of the first embodiment. The point in this structure differing from FIG. 2 is that the main signal line MS10 contains a main precharge signal line MPDL1, and the main signal line MS20 contains a main precharge signal line MPDL2.

The main precharge signal line MPDL1 is here coupled by way of the NAND gate NAND11 to the precharge circuit for the bit line pair BLN1, BLT1. The main precharge signal line MPDL2 is in the same way coupled by way of the NAND gate NAND21 to the precharge circuits for the bit line pair BLN2, BLT2.

In a more detailed description, the main precharge signal line MPDL1 is coupled to one input of the NAND gate NAND11. The other input of the NAND gate NAND11 is coupled to the column select signal line CL1. The output of the NAND gate NAND11 is coupled to the sub-precharge signal line SPDL1. The sub-precharge signal line SPDL1 is coupled to the precharge circuit for the bit line pair BLN1, BLT1. The precharge circuit is here comprised of three NMOS transistors the same as in FIG. 2.

Therefore, when the sub-precharge signal line SPDL1 is in the H (high) state, then the three NMOS transistors are all on, and a precharge voltage HVCC is applied to the bit line pair BLN1, BLT1. If the sub-precharge signal line SPDL1 is in the L (low) state then the three NMOS transistors are all off, and no precharge voltage HVCC is applied to the bit line pair BLN1, BLT1.

The main precharge signal line MPDL2 is in the same way coupled to one input of the NAND gate NAND21. The other input of the NAND gate NAND21 is coupled to the column select signal line CL1. The output of the NAND gate NAND21 is coupled to the sub-precharge signal line SPDL2. The sub-precharge signal line SPDL2 is coupled to the precharge circuit for the bit line pair BLN2, BLT2. The precharge circuit is here comprised of three NMOS transistors the same as in FIG. 2.

Therefore, when the sub-precharge signal line SPDL2 is in the H (high) state, then the three NMOS transistors are all on, and a precharge voltage HVCC is applied to the bit line pair BLN2, BLT2. If the sub-precharge signal line SPDL2 is in the L (low) state then the three NMOS transistors are all off, and no precharge voltage HVCC is supplied to the bit line pair BLN2, BLT2. The other structures are identical to FIG. 2 so a description is omitted.

Compared to the comparative example in FIG. 3, the embodiment in FIG. 2 requires no main precharge signal line (MPDL1, MPDL2) and no NAND gates (NAND11, NAND21) for the sub-precharge signal lines. However, the sub-precharge signal lines (SPDL1, SPDL2) for each of the subarrays in FIG. 3 are mutually coupled between the subarrays, and configure the precharge signal lines (PDL1, PDL2) in FIG. 2. In other words, the circuit scale can be reduced to an extent equivalent to the reduction in the number of sub-precharge signal lines (SPDL1, SPDL2) and the NAND gates (NAND11, NAND21) for the sub-precharge signal lines.

Here, the sub-precharge signal lines (SPDL1, SPDL2) and the NAND gates (NAND11, NAND21) for the sub-precharge signal lines in the subarray SA22 of FIG. 3, are also required in each subarray so that the embodiment shown in FIG. 2 renders a large effect in reducing the circuit scale.

Figure 11:
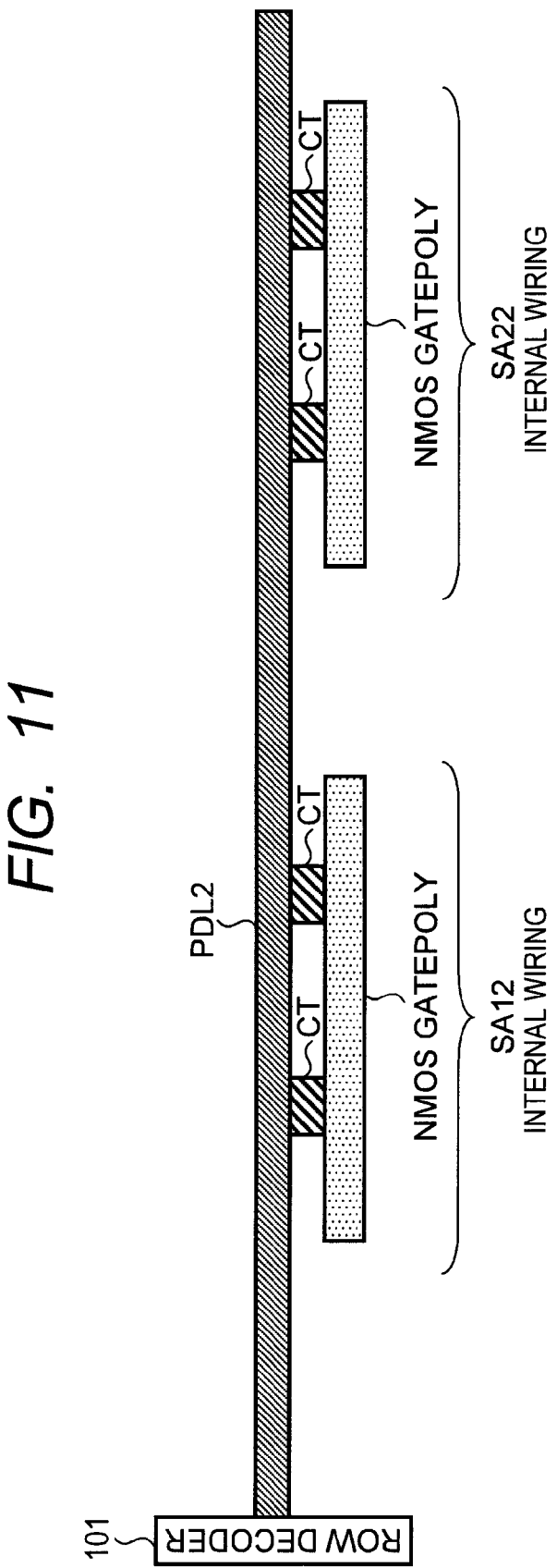
FIG. 11 is a cross sectional view taken along the length of the precharge signal line PDL2 of FIG. 2, and shows the internal wiring of the subarrays SA12, SA22.
Figure 12:
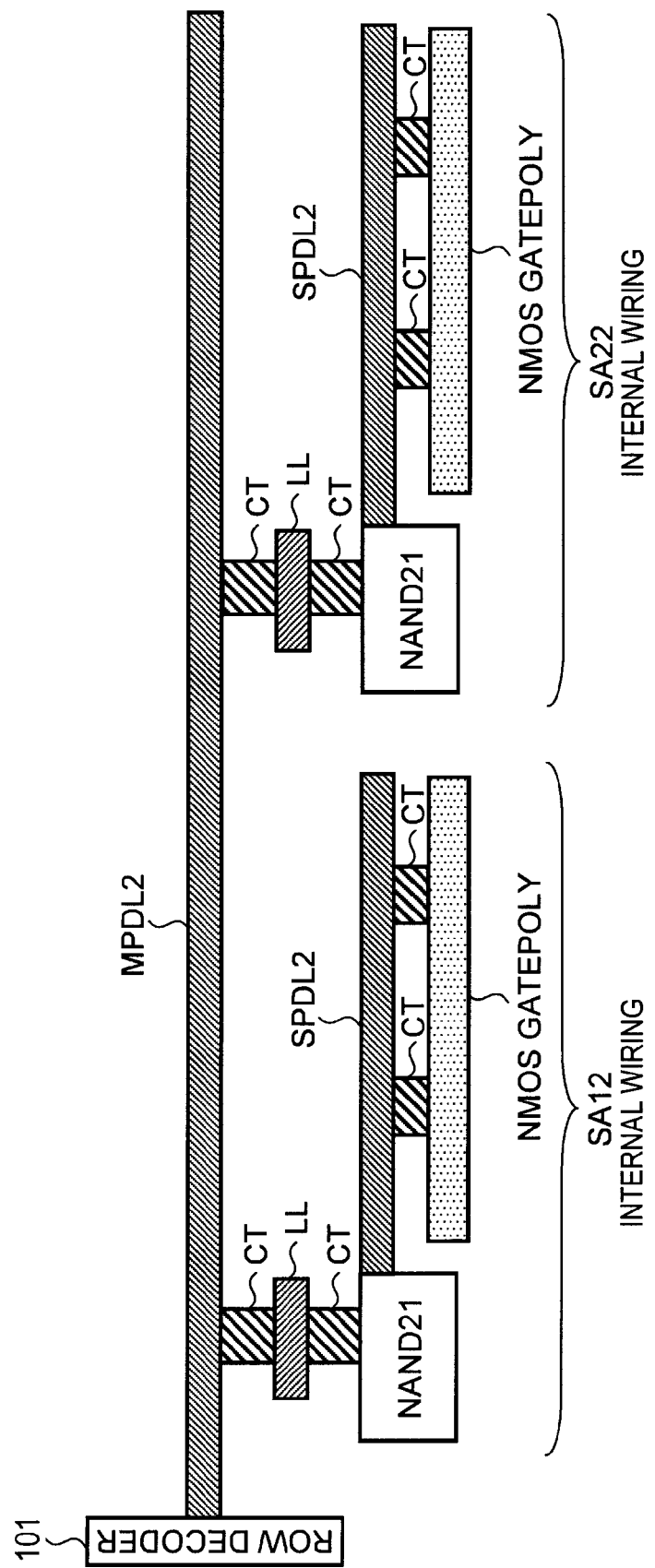
FIG. 12 is a cross sectional view taken along the length of the main precharge signal line MPDL2 and the sub-precharge signal line SPDL2 in FIG. 3.

The cross sectional structure in FIG. 2 and FIG. 3 is described next while referring to FIG. 11 and FIG. 12. FIG. 11 is a cross sectional view taken along the length of the precharge signal line PDL2 of FIG. 2. FIG. 11 shows the internal wiring of the subarrays SA12, SA22. FIG. 12 is a cross sectional view taken along the length of the main precharge signal line MPDL2 and the sub-precharge signal line SPDL2 in FIG. 3. FIG. 12 shows the internal wiring of the subarray SA12 and SA22.

As shown in FIG. 11, the precharge signal line PDL2 of FIG. 2 is coupled by way of the contacts CT within each subarray, to the gate wiring (NMOS GATEPOLY) of the NMOS transistor configuring the precharge circuit. In other words, the precharge signal line of the present embodiment as was described above, is capable of being formed from a single wiring layer.

As shown in FIG. 12 on the other hand, the main precharge signal line MPDL2 of FIG. 3, is coupled by way of the wiring layer LL (wiring extending inwards in the drawing) and the contact CT within each subarray, to the NAND gate NAND21. The sub-precharge signal line SPDL2 extending in parallel with the main precharge signal line MPDL2 from the NAND gate NAND21, is coupled by way of the contact CT to the gate wiring (NMOS GATEPOLY) of the NMOS transistor configuring the precharge circuit. The precharge signal line of the comparative example is in this way comprised of a main precharge signal line and a sub-precharge signal line. These signal lines must be formed from separate wiring layers and cannot be formed from a single wiring layer.

Figure 4:
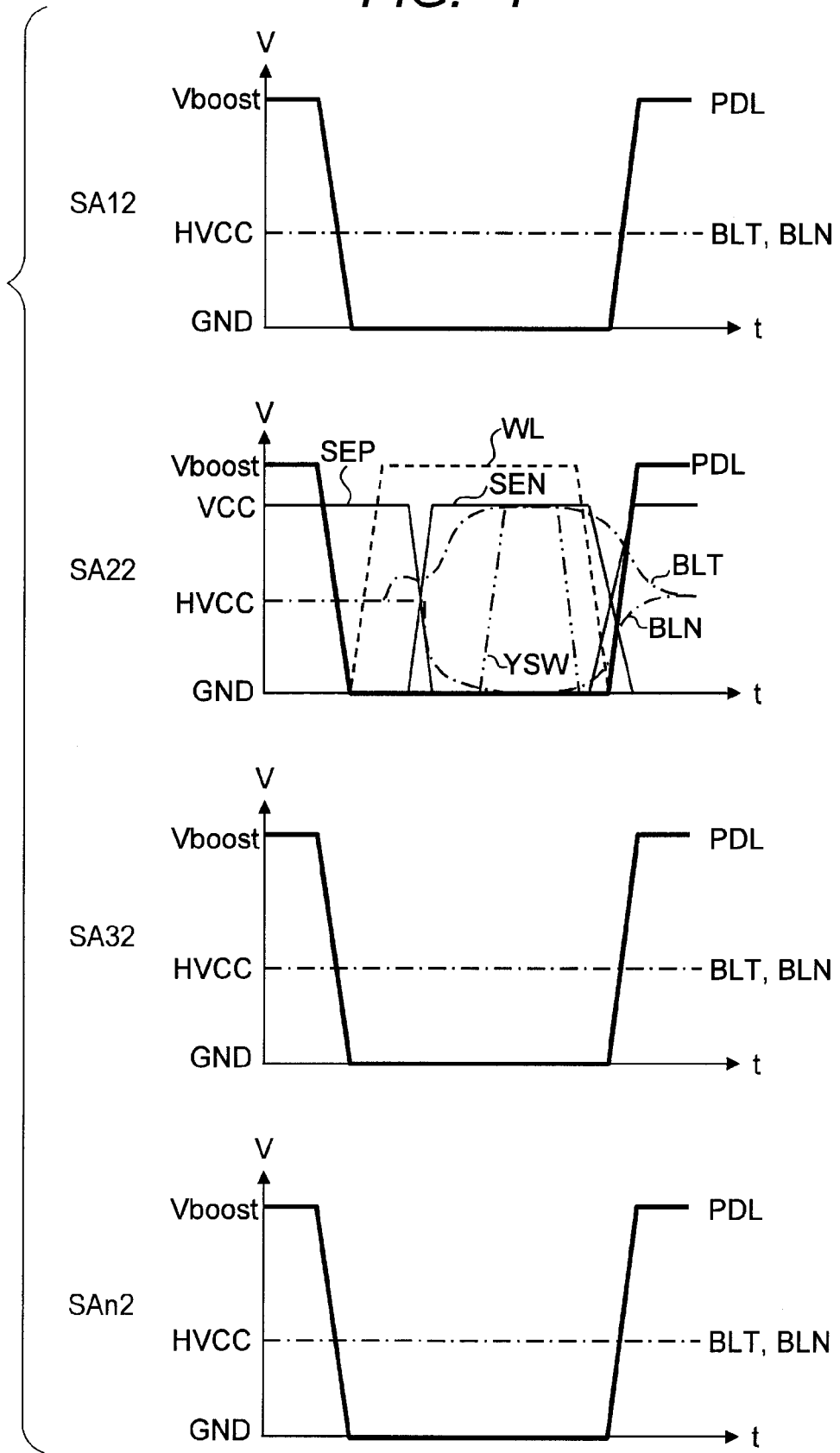
FIG. 4 is a timing chart for describing the operation of the hierarchical DRAM according to the first embodiment.

The operation of the hierarchical DRAM of the first embodiment is described next while referring to FIG. 4. FIG. 4 is a timing chart for describing the operation of the hierarchical DRAM according to the first embodiment. FIG. 4 shows the read out operation in a memory cell for the subarray SA22. The subarray SA12, SA22, SA32, SAn2 operation is shown in order from the top in FIG. 4. Namely, not only the subarray SA22 for readout is shown, but also the operation of the subarrays SA12, SA32, SAn2 belonging to the same subarray row having the same precharge signal line.

The operation of the subarray SA22 shown second from the top in FIG. 4 is first of all described. The bit line pairs BLT, BLN are precharged in standby states other than readout and write operations or refresh operations. Namely, the precharge signal line. PDL is in the H state, and the precharge voltage HVCC is applied to the bit line pairs BLT, BLN. Here, the H signal voltage for the precharge signal line PDL is a voltage which is the supply voltage VCC raised to a higher voltage Vboost.

In the readout operation, the precharge signal line PDL switches to the L state, and the supply of a precharge voltage HVCC to the bit line pairs BLT, BLN is then cut off. The subword line WL switches from the L to H state at the same time, to select the applicable memory cell for readout. Here, the H signal voltage of the subword line WL is a voltage which is the supply voltage VCC raised to a higher voltage Vboost. The data in the memory cell in this way causes a voltage differential in the bit line pair BLT, BLN. The subsense enable signal line SEP switches from the H (supply voltage VCC) state to the L (ground voltage GND) state at this timing, and the subsense enable signal line SEN switches from the L (ground voltage GND) state to the H (supply voltage VCC) state that, in other words drives the sense amplifiers of the bit line pair BLT, BLN. The sense amplifier amplifies the bit line pair BLT, BLN voltage differential.

The sub Y switching signal line YSW switches from the L (ground voltage GND) state to the H (supply voltage VCC) state at a timing where the voltage differential in the bit line pair BLT, BLN is sufficiently large, and the Y switch turns on, and the data is read out. The sub Y switching signal line YSW then switches from L state to H state, and the Y switch turns off. The subword line WL switches from the H to the L state, and the memory cell for readout is switched to the non-select state. The subsense enable signal line SEP then switches from L to H state, and the subsense enable signal line SEN switches from H to L state. Moreover, the precharge signal line PDL switches from L to H state, and a precharge voltage HVCC is again applied to the bit line pair BLT, BLN. The readout operation ends in this way. In the write operation, the data is written after the Y switch has turned on in the readout operation. In all other operations, the write operation is the same as the read operation.

The operation of the subarrays SA12, SA32, SAn2 shown in the order of first, third, fourth from the top of FIG. 4 is described next. In the present embodiment as shown in FIG. 2, the precharge signal line PDL is jointly coupled to the subarrays SA12, SA32, SAn2 belonging to the same subarray column as the subarray SA22. The precharge signal line PDL therefore switches at the same timing for subarrays SA12, SA32, . . . , SAn2 as used for the subarray SA22. In other words, the supply of a precharge voltage HVCC to the bit line pairs is temporarily cut off. However, none of the subword lines are selected, and the sense amplifier is also inactive, and there is a slight amount of time so that the voltage of the bit line pair is maintained at the precharge voltage HVCC. Therefore, there is no damage to the data within the memory cell and no particular problems occur.

Figure 5:
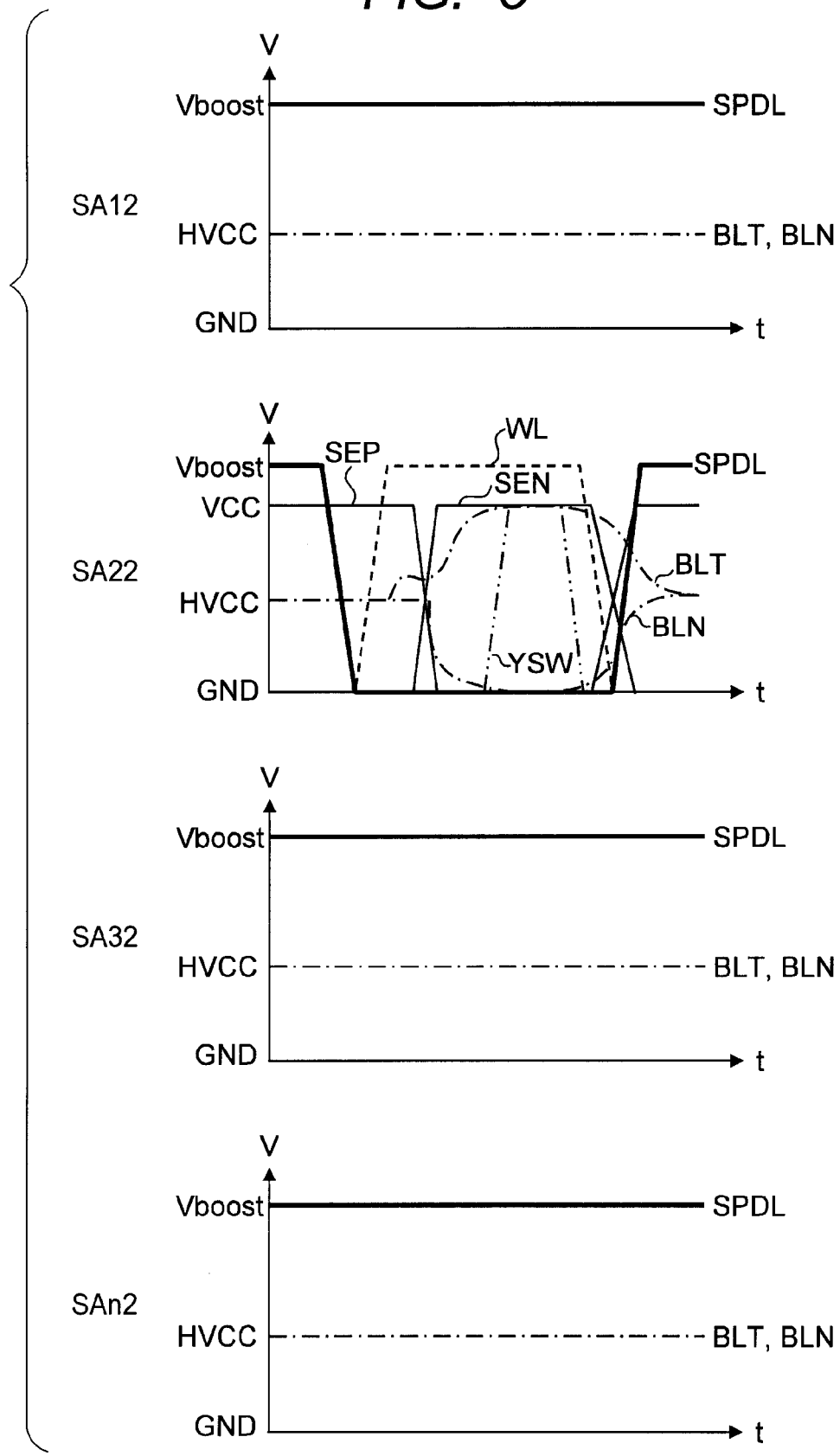
FIG. 5 is a timing chart for describing the operation of the hierarchical DRAM of a comparative example of the first embodiment.

The operation of the hierarchical DRAM of the comparative example of the first embodiment is described next utilizing FIG. 5. FIG. 5 is a timing chart for describing the operation of the hierarchical DRAM of the comparative example of the first embodiment. The operation of the subarray SA22 in FIG. 5 is the same as the operation of the subarray SA22 in FIG. 4. In FIG. 4, the precharge signal line PDL switches at the same timing for the subarrays SA12, SA32, . . . , SAn2 as used for the subarray SA22.

On the other hand in FIG. 5, even if the sub-precharge signal line SPDL for the subarray SA22 switches (states), the sub-precharge signal lines SPDL for the other subarrays SA12, SA32, . . . , SAn2 are not switched. No switching occurs in the hierarchical DRAM of the comparative example described using FIG. 3, because the sub-precharge signal lines SPDL are coupled by way of a logic circuit to the main precharge signal line MPDL and the column select signal line CL.

In the read operation and the write operation as shown in FIG. 4, the precharge signal line PDL switches at the same timing for the subarrays SA12, SA32, . . . , SAn2 as used for the subarray SA22 so the consumption current appears prone to increase. On the other hand, the refresh operation is performed simultaneously on the subarrays such as SA12, SA22, SA33 so that the power consumption also lowered by an amount equal to the reduction in the circuit scale. In other words, a total reduction in the amount of current consumption is achieved.

Second Embodiment

Figure 6:
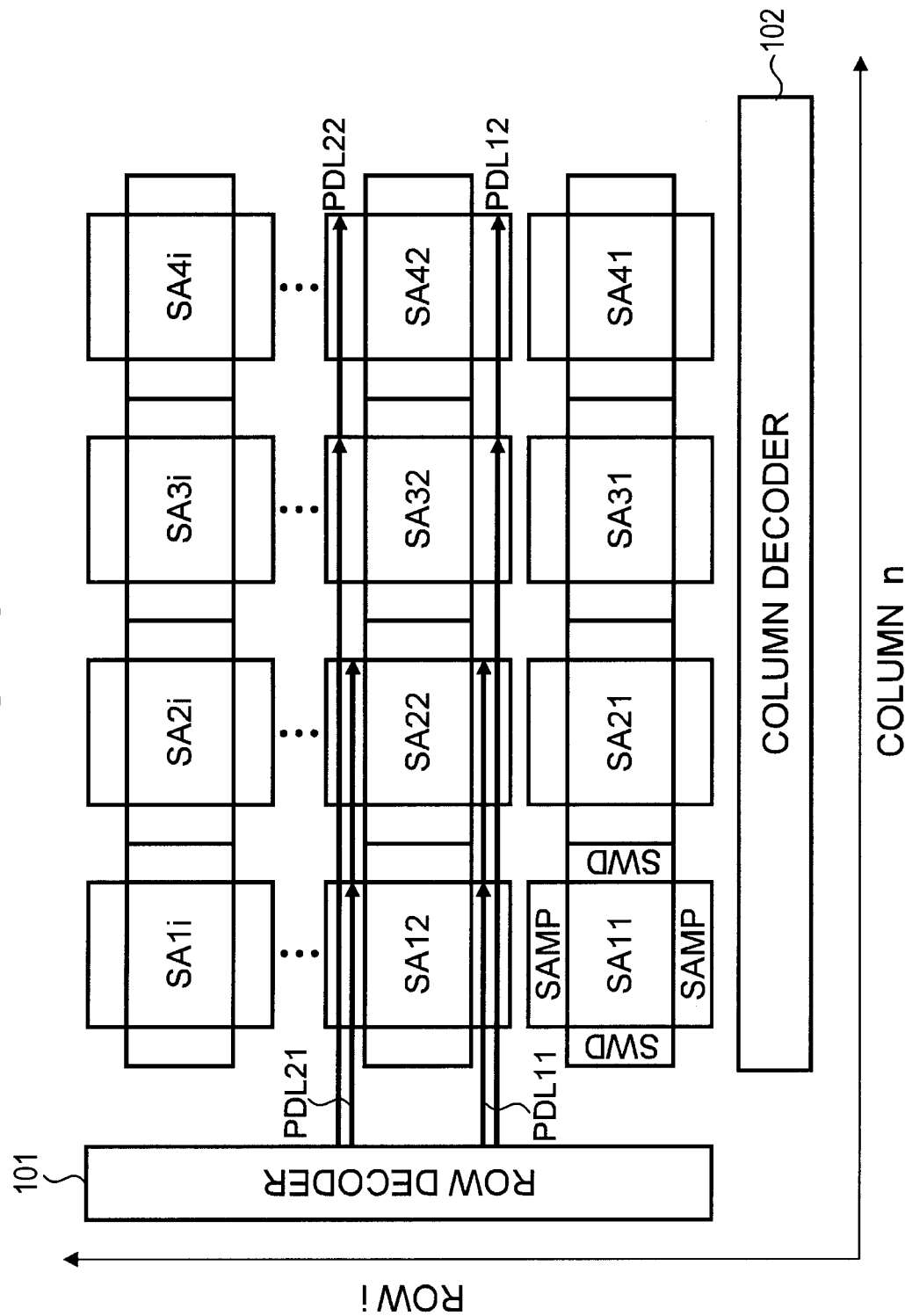
FIG. 6 is a diagrammatic flat view of the hierarchical DRAM according to the second embodiment.

The hierarchical DRAM of the second embodiment is described next while referring to FIG. 6. FIG. 6 is a diagrammatic flat view of the hierarchical DRAM according to the second embodiment. In FIG. 6, the n of FIG. 1 equals 4, with four subarrays arrayed along the row direction. The precharge signal lines PDL1, PDL2 in FIG. 1 are here respectively jointly coupled to all the subarrays belonging to the same subarray row.

Figure 7:
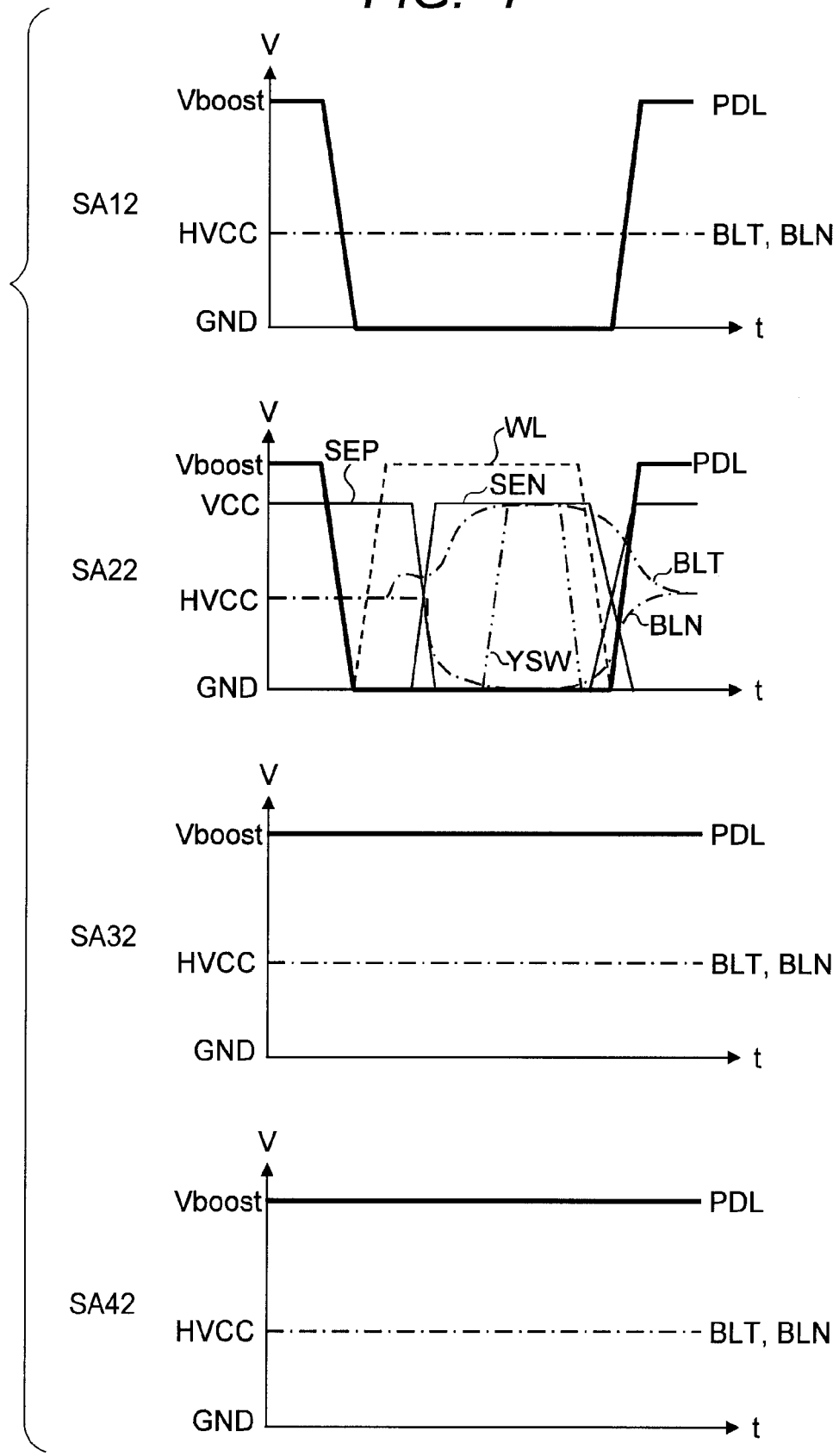
FIG. 7 is a timing chart for describing the operation of the hierarchical DRAM according to the second embodiment.

In FIG. 6 however, the precharge signal lines PDL11, PDL21 are jointly coupled only to the subarrays SA12, SA22. The precharge signal lines PDL12, PDL22 on the other hand are jointly coupled only to the subarrays SA32, SA42, and are not coupled to the subarrays SA12, SA22. The other structures are identical to the structure in FIG. 1. In this arrangement there is therefore no need to always jointly couple the precharge signal lines to all subarrays belonging to the same subarray row, and further jointly coupling at least just two adjacent subarrays in the row direction is sufficient. In FIG. 7, all signal lines other than the precharge signal lines PDL11, PDL12, PDL21, and PDL22 are omitted.

The hierarchical DRAM operation of the second embodiment is described next while referring to FIG. 7. FIG. 7 is a timing chart for describing the operation of the hierarchical DRAM of the second embodiment. The operation of the subarray SA22 in FIG. 7 is identical to the operation of the subarray SA22 in FIG. 4. In FIG. 4, the precharge signal line PDL switches at the same timing for the subarrays SA12, SA32, . . . , SAn2 as was used for the subarray SA22.

In FIG. 7 however, the sub-precharge signal line SPDL switches at the same timing for subarray SA12 as was used for the subarray SA22. The sub-precharge signal line SPDL for the subarrays SA32, SA42 does not however switch. In the hierarchical DRAM for FIG. 6 as already described, the precharge signal lines PDL11, PDL21 are jointly coupled only to the respective subarrays SA12, SA22. The precharge signal lines PDL12, PDL22 on the other hand are jointly coupled only to the respective subarrays SA32, SA42 because there is no coupling to the subarrays SA12, SA22.

Third Embodiment

Figure 8:
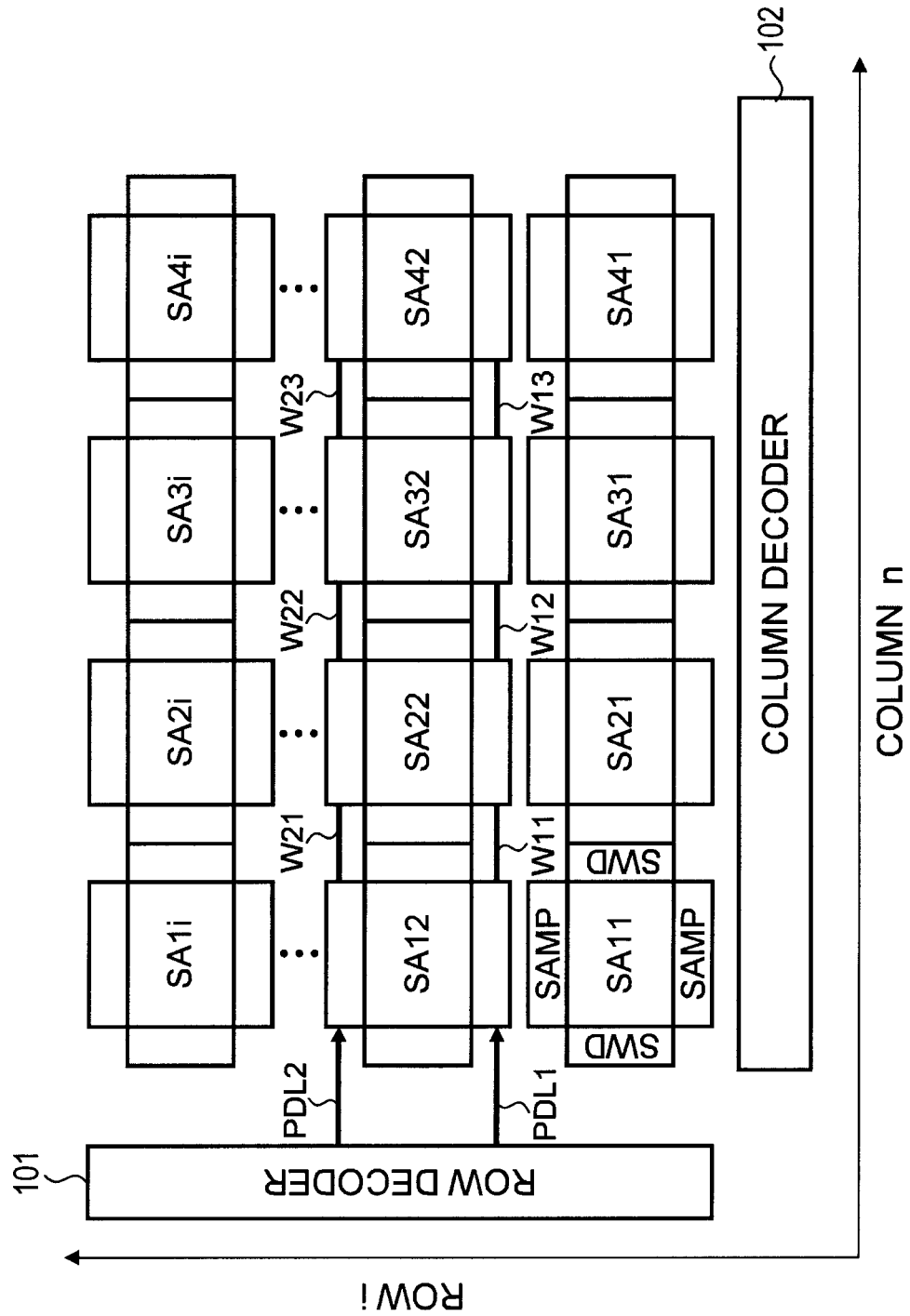
FIG. 8 is a diagrammatic flat view of the hierarchical DRAM according to the third embodiment.

The hierarchical DRAM of the third embodiment is described next while referring to FIG. 8. FIG. 8 is a diagrammatic flat view of the hierarchical DRAM according to the third embodiment. In FIG. 8, the n of FIG. 1 equals 4, with four subarrays arrayed along the row direction. Here, in FIG. 1, the precharge signal lines PDL1, PDL2 are respectively jointly coupled to all the subarrays belonging in the same subarray row.

In contrast, in FIG. 8, the precharge signal lines PDL11, PDL21 are respectively coupled only to the subarray SA12. In the third embodiment, notice was taken of the fact that internal wiring is required for conveying the precharge signals internally even in subarrays of the related art and so multiple coupling wires W11-W13, W21-W23 were also newly provided to couple the internal wiring of two adjacent subarrays. In the example in FIG. 8, the six wires for the coupling wires W11-W13, W21-W23 are formed two each between the adjacent subarrays. The precharge signal lines PDL11, PDL21 may supply the precharge signals just to the subarray SA12 mounted directly near the row recorder 101 by utilizing these coupling wires W11-W13, W21-W23 in order to couple internal wiring controlled by the same logic according to the precharge signal lines of two adjacent subarrays. Each of the coupling wires W11-W13, W21-W23 are moreover formed so as to couple the adjacent subarray internal wiring at approximately the minimum possible distance. Implementing this structure allows drastically reducing the mounting area required for forming the precharge signal lines even if utilizing a subarray structure of the related art.

Fourth Embodiment

Figure 9:
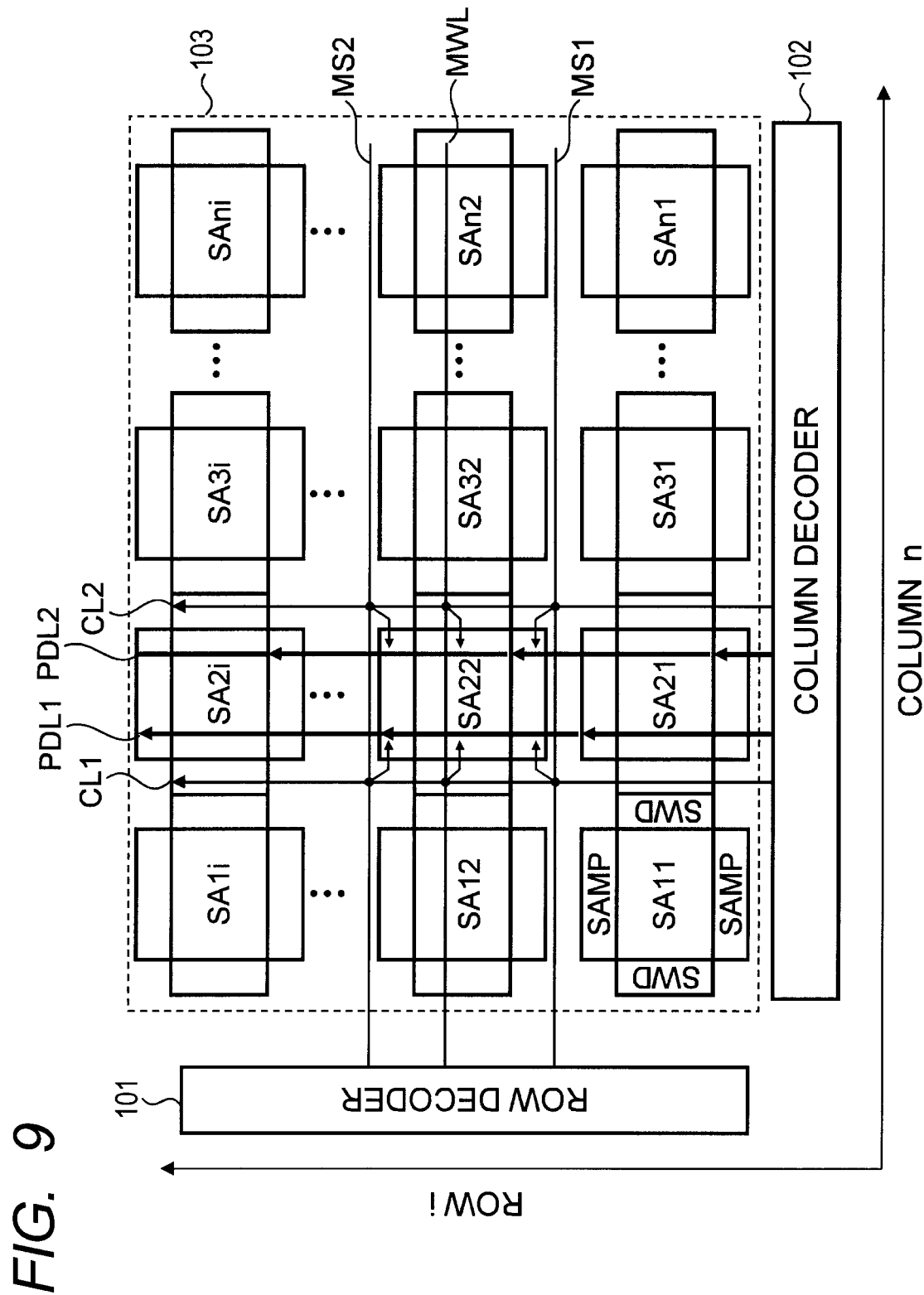
FIG. 9 is a diagrammatic flat view of the hierarchical DRAM according to the fourth embodiment.
Figure 10:
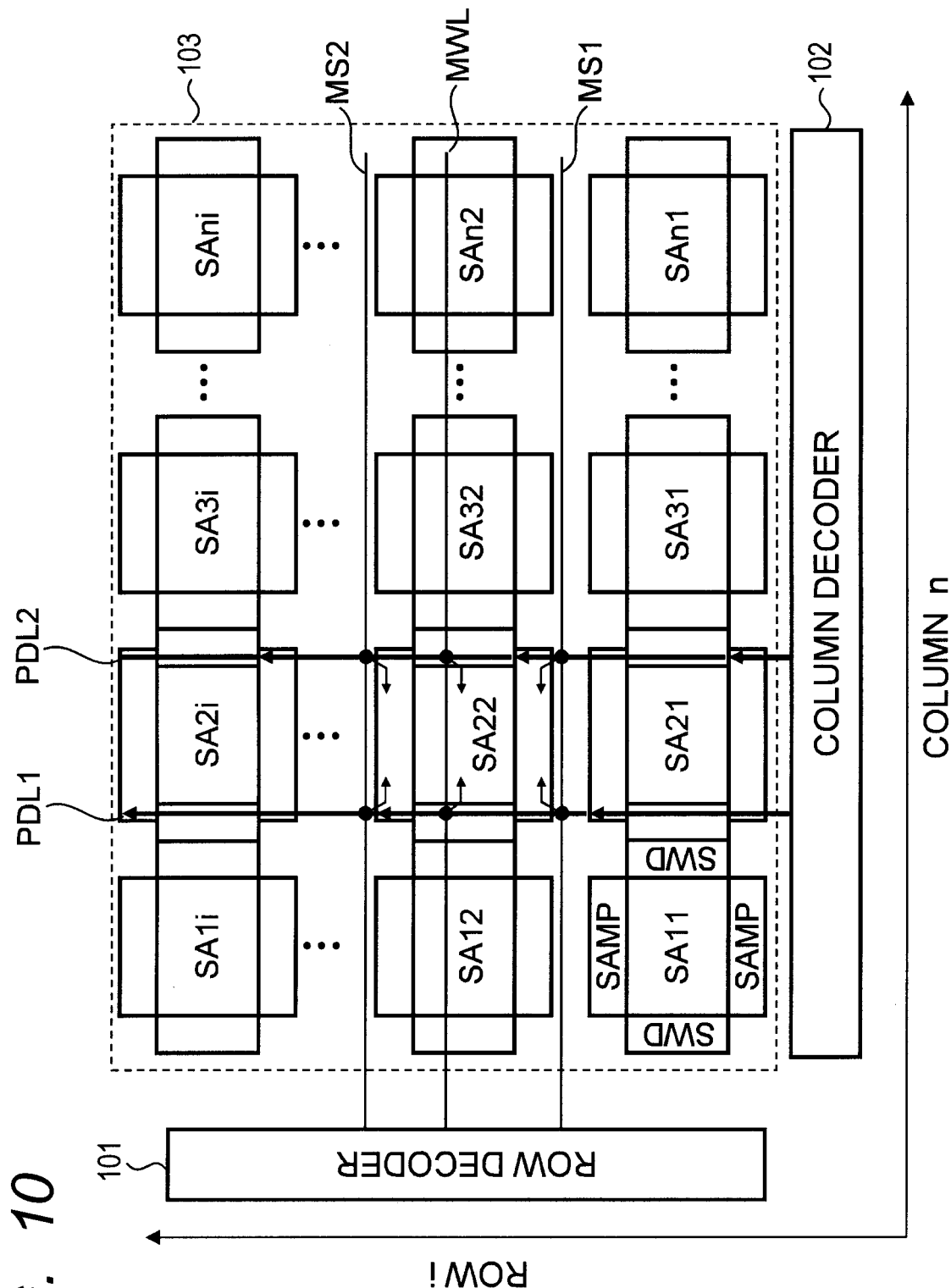
FIG. 10 is a diagrammatic flat view of another hierarchical DRAM according to the fourth embodiment.

The first through the third embodiments described examples for controlling multiple subarrays arrayed in the row direction by the joint precharge signals. However a structure as shown in FIG. 9, may utilize multiple subarrays SA21, SA22, . . . , SA2i arrayed in the column direction jointly controlled by the precharge signal lines PDL1, PDL2 extending in parallel with the column select signal lines CL1, CL2. In this case, using the column select signal lines CL1, CL2 in common with the precharge signal lines PDL1, PDL2 allows reducing the amount of wiring in proportion to the (fewer) column select signal lines CL1, CL2. However the column select signal lines CL1, CL2 normally are H select and the precharge signal lines PDL are L select so that joint usage of both requires standardizing one of them (CL or PDL) to either H select or L select.

Fifth Embodiment

Figure 13:
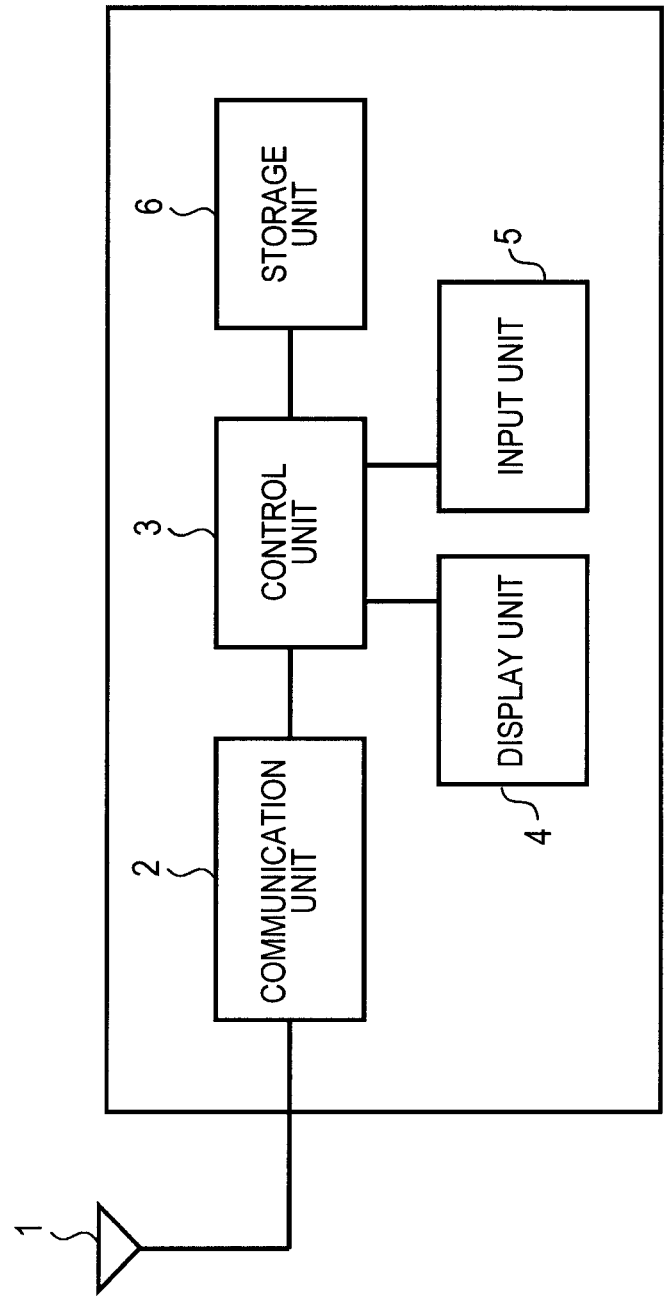
FIG. 13 is a block diagram of the portable communication terminal according to the fifth embodiment.

FIG. 13 shows an example of a portable communication terminal ideal as an electronic device adapted to the storage device of the embodiment of the present invention. This portable communication terminal is comprised of an antenna 1, a communication unit 2, a control unit 3, a display unit 4, an input unit 5, and a storage unit 6. The storage device of the present embodiment can be applied at this storage unit 6. The communication unit 2 performs communications by way of the antenna 1. The control unit 3 controls the communication unit 2, the display unit 4, the input unit 5, and the storage unit 6. The display unit 4 is equipment for visually conveying information by way of liquid crystal display elements or organic EL display elements. The input unit 5 is for example entry buttons for inputting letters or numbers. The storage unit 6 is a storage or memory apparatus utilized by the control unit 3. Though the idle period in the portable communication terminal where there is no access of the memory unit 6 is considered relatively long, that idle period must also be utilized for responding to an incoming message. The storage device according to the present invention can therefore be expected to reduce the power consumption during refresh so that the embodiment will render the effect of lowering power consumption in the portable communication terminal in the idle period where the refresh operation is repeatedly performed.

The specifications of this invention were described while referring to the embodiments however the present invention is not limited by these specifications. The structure and the details of the present invention can be rendered as all manner of modifications and adaptations without departing from the scope of the invention as is readily understood by one skilled in the art.

What is claimed is:

1. A semiconductor device, comprising:
    a plurality of subarrays arrayed in a matrix with row and column directions, each of the subarrays including a plurality of memory cells, bit lines coupled to the memory cells and precharge circuits configured to precharge the bit lines;
    a plurality of column select signal lines extending along a column direction to select a column of the subarrays;
    a plurality of main word lines extending along a row direction to select a row of the subarrays; and
    a plurality of precharge signal lines to supply a precharge signal to the precharge circuits,
    wherein at least two adjacently mounted subarrays are controlled with a same logical state in response to the precharge signal,
    wherein the subarrays controlled with the same logical state are coupled to a same precharge signal line, and
    wherein the precharge signal lines are formed as two lines each for each subarray row or column.

2. The semiconductor device according to claim 1,
    wherein all of the subarrays adjacently mounted in the row direction or the column direction are controlled by the same logical state in response to the precharge signal.

3. The semiconductor device according to claim 1, further comprising:
    a control unit configured to control the precharge signal,
    wherein each of subarrays includes internal wiring thereof configured to convey the precharge signal within each of the subarrays,
    wherein the subarrays include a first subarray coupled to the control unit with one of the precharge signal lines and a second subarray arranged adjacent to the first subarray, and
    wherein the second subarray is coupled to the one of the precharge signal lines through an internal wiring of the first subarray.

4. The semiconductor device according to claim 3, wherein the one of the precharge signal lines is arranged between the control unit and the first subarray.

5. The semiconductor device according to claim 3, wherein the internal wiring of the first subarray and an internal wiring of the second subarray are coupled with a wiring being an approximately minimum distance.

6. The semiconductor device according to claim 1, wherein the same logic precharge signal is input to the applicable two precharge signal lines.

7. The semiconductor device according to claim 1,
    wherein the subarray includes:
    a subword line extending along the row direction and coupled to a memory cell; and
    a logic gate whose input is coupled to the column select signal line and the main word signal line, and whose output is coupled to the subword line.

8. The semiconductor device according to claim 7, wherein two bit lines are coupled to one memory cell.

9. The semiconductor device according to claim 1, wherein the precharge circuit includes a NMOS transistor.

10. The semiconductor device according to claim 1, wherein the precharge signal line is formed from a single wire layer.

11. The semiconductor device according to claim 1, wherein the precharge signal line is also a column select signal line.

12. The semiconductor device according to claim 1, wherein the semiconductor device is DRAM.

13. A communication device comprising a semiconductor device according to claim 1.

* * * * *